United States Patent
Tahara et al.

(10) Patent No.: US 11,323,193 B2
(45) Date of Patent: May 3, 2022

(54) FILTER CIRCUIT AND RADIO-FREQUENCY MODULE

(71) Applicant: Murata Manufacturing Co., Ltd., Kyoto (JP)

(72) Inventors: Kenji Tahara, Kyoto (JP); Shou Matsumoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 26 days.

(21) Appl. No.: 16/822,838

(22) Filed: Mar. 18, 2020

(65) Prior Publication Data

US 2020/0220635 A1    Jul. 9, 2020

Related U.S. Application Data

(63) Continuation of application No. PCT/JP2018/033975, filed on Sep. 13, 2018.

(30) Foreign Application Priority Data

Sep. 21, 2017 (JP) .............................. JP2017-181571

(51) Int. Cl.
*H04J 1/04* (2006.01)
*H04B 1/52* (2015.01)
(Continued)

(52) U.S. Cl.
CPC ............ *H04J 1/045* (2013.01); *H03K 17/164* (2013.01); *H04B 1/52* (2013.01); *H04B 1/56* (2013.01); *H03D 2200/0058* (2013.01)

(58) Field of Classification Search
CPC ......... H03D 2200/0058; H03K 17/164; H04B 1/0057; H04B 1/006; H04B 1/52; H04B 1/56; H04J 1/045
See application file for complete search history.

(56) References Cited

U.S. PATENT DOCUMENTS

2007/0190954 A1    8/2007    Murakami et al.
2014/0329475 A1    11/2014    Ellä et al.
(Continued)

FOREIGN PATENT DOCUMENTS

CN    107196620 A    9/2017
JP    2012-034049 A    2/2012
(Continued)

OTHER PUBLICATIONS

International Search Report for International Application No. PCT/JP2018/033975 dated Oct. 16, 2018.
(Continued)

*Primary Examiner* — Kibrom T Hailu
*Assistant Examiner* — Nizam U Ahmed
(74) *Attorney, Agent, or Firm* — Pearne & Gordon LLP (57) ABSTRACT

A filter circuit includes a first switch circuit that exclusively connects a first common terminal to either of a first selection terminal and a second selection terminal; a first signal terminal that is connected to the first selection terminal and that is for communicating a first communication signal belonging to a first frequency range, which is a frequency range of a first communication band; a second signal terminal that is connected to the second selection terminal and that is for communicating a second communication signal belonging to a second frequency range, which is the frequency range of a second communication band and which is at least partially overlapped with the first frequency range; and a first band pass filter one end of which is connected to the first common terminal and which uses both the first frequency range and the second frequency range as pass bands.

19 Claims, 4 Drawing Sheets

FIGURES IN () INDICATE FREQUENCY RANGES [MHz]

(51) Int. Cl.
 *H04B 1/56* (2006.01)
 *H03K 17/16* (2006.01)

(56) References Cited

U.S. PATENT DOCUMENTS

2016/0134308 A1  5/2016  Schmidhammer
2017/0264336 A1* 9/2017  Saji ..................... H03H 9/6483

FOREIGN PATENT DOCUMENTS

| JP | 2014-526847 A | 10/2014 |
| JP | 2016-524416 A | 8/2016 |
| WO | 2005/088833 A1 | 9/2005 |

OTHER PUBLICATIONS

Written Opinion for International Application No. PCT/JP2018/033975 dated Oct. 16, 2018.

* cited by examiner

FIGURES IN () INDICATE
FREQUENCY RANGES [MHz]

FIGURES IN ( ) INDICATE FREQUENCY RANGES [MHz]

FILTER CIRCUIT AND RADIO-FREQUENCY MODULE

This is a continuation of International Application No. PCT/JP2018/033975 filed on Sep. 13, 2018 which claims priority from Japanese Patent Application No. 2017-181571 filed on Sep. 21, 2017. The contents of these applications are incorporated herein by reference in their entireties.

BACKGROUND OF THE DISCLOSURE

Field of the Disclosure

The present disclosure relates to filter circuits and radio-frequency modules. In particular, the present disclosure relates to a filter circuit and a radio-frequency module for performing multiband communication using multiple frequency ranges.

Description of the Related Art

Communication apparatuses are in widespread use, which perform the multiband communication using multiple communication bands.

Evolved Universal Terrestrial Radio Access (E-UTRA) designed by Third Generation Partnership Project (3GPP) is exemplified as a communication standard defining the multiband communication. The E-UTRA is also referred to as Long Term Evolution (LTE) (Registered trademark). In the E-UTRA, the frequency ranges are defined for the respective multiple communication bands used in the multiband communication.

Patent Document 1 discloses a multiband front-end circuit including filter circuits that process signals of multiple communication bands. For example, the filter circuit illustrated in FIG. 5 in Patent Document 1 processes signals of Bands 7, 38, and 40 in the E-UTRA.

Patent Document 1: Japanese Unexamined Patent Application Publication (Translation of PCT Application) No. 2014-526847

BRIEF SUMMARY OF THE DISCLOSURE

However, since the front-end circuit in Patent Document 1 includes the filters for the respective communication bands, the number of required filters is increased with the increasing number of communication bands to cause a problem of increasing the size of the apparatus.

In order to resolve the above problem, it is an object of the present disclosure to provide a filter circuit that is less likely to cause an increase in size of the apparatus even if the number of communication bands is increased and a radio-frequency module including such a filter circuit.

In order to achieve the above object, a filter circuit according to one aspect of the present disclosure includes a first switch circuit that includes a first common terminal, a first selection terminal, and a second selection terminal and that exclusively connects the first common terminal to either of the first selection terminal and the second selection terminal; a first signal terminal that is connected to the first selection terminal and that is for communicating a first communication signal belonging to a first frequency range, which is a frequency range of a first communication band; a second signal terminal that is connected to the second selection terminal and that is for communicating a second communication signal belonging to a second frequency range, which is the frequency range of a second communication band exclusively used with the first communication band and which is at least partially overlapped with the first frequency range; and a first band pass filter one end of which is connected to the first common terminal and which uses both the first frequency range and the second frequency range as pass bands.

According to the present disclosure, filtering of the first communication signal in the first communication band and the second communication signal in the second communication band is performed by the single first band pass filter. Accordingly, the number of required filters is decreased, compared with a case in which filtering of the first communication signal and the second communication signal is performed by separate filters.

Consequently, it is possible to achieve the filter circuit that is less likely to cause an increase in size of the apparatus even if the number of communication bands is increased and the radio-frequency module including such a filter circuit.

DETAILED DESCRIPTION OF THE DISCLOSURE

Embodiments of the present disclosure will herein be described in detail with reference to the drawings. All the embodiments described below indicate comprehensive or specific examples. Numerical values, shapes, materials, components, the arrangement of the components, the connection mode of the components, and so on, which are indicated in the embodiments described below, are only examples and are not intended to limit the present disclosure. Among the components in the embodiments described below, the components that are not described in the independent claims are described as optional components.

First Embodiment

A filter circuit according to a first embodiment is a filter circuit for performing multiband communication using multiple communication bands. A filter circuit for performing the multiband communication using five communication bands of Bands 7, 25, 34, 39 and 41 defined in the E-UTRA will now be described as a specific example.

Figure 1A:
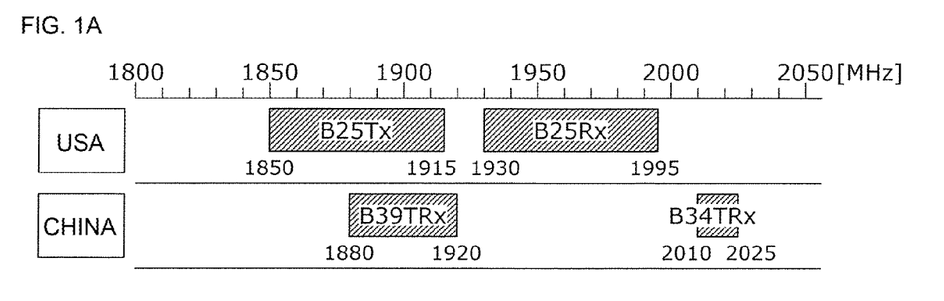
FIG. 1A is a diagram indicating an example of the frequency ranges of communication bands.
Figure 1B:
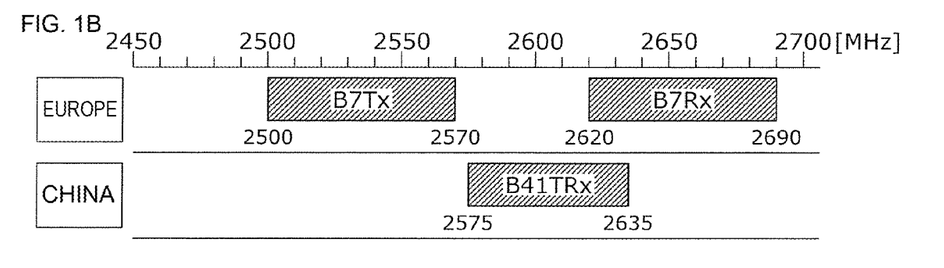
FIG. 1B is a diagram indicating an example of the frequency ranges of communication bands.

FIG. 1A and FIG. 1B are diagrams indicating the frequency ranges of the five communication bands. The five communication bands include the communication bands the duplex mode of which is Frequency Division Duplex (FDD) and the communication bands the duplex mode of which is Time Division Duplex (TDD). In the FDD, transmission and reception are concurrently performed using a transmission frequency band and a reception frequency band that are different from each other. In the TDD, transmission and reception are performed using one transmission-reception frequency range in time division.

The duplex mode of Band 7 is the FDD and is operated in Europe. A transmission frequency range B7Tx of Band 7 extends from 2,500 MHz to 2,570 MHz and a reception frequency range B7Rx of Band 7 extends from 2,620 MHz to 2,690 MHz.

The duplex mode of Band 25 is the FDD and is operated in USA. A transmission frequency range B25Tx of Band 25 extends from 1,850 MHz to 1,915 MHz and a reception frequency range B25Rx of Band 25 extends from 1,930 MHz to 1,995 MHz.

The duplex mode of Band 34 is the TDD and is operated in China. A transmission-reception frequency range B34TRx of Band 34 extends from 2,010 MHz to 2,025 MHz.

The duplex mode of Band 39 is the TDD and is operated in China. A transmission-reception frequency range B39TRx of Band 39 extends from 1,880 MHz to 1,920 MHz.

The duplex mode of Band 41 is the TDD and is operated in China. A transmission-reception frequency range B41TRx of Band 41 extends from 2,575 MHz to 2,635 MHz. As for Band 41, only the range operated by a specific telecommunication carrier in China, in the entire range of Band 41 defined in the E-UTRA, is indicated.

The filter circuit for performing the multiband communication is generally composed of duplexers provided for the respective communication bands the duplex mode of which is the FDD and a multiplexer composed of filters provided for the respective communication bands the duplex mode of which is the TDD. The duplexer performs demultiplexing and multiplexing of a transmission signal and a reception signal of the corresponding FDD communication band and the multiplexer performs the demultiplexing and multiplexing of a transmission-reception signal of each TDD communication band.

For example, the filter circuit in Patent Document 1 described above also has such a configuration. In addition, a reference example having such a configuration can be considered also for the filter circuit for performing the multiband communication using the five communication bands of Bands 7, 25, 34, 39, and 41.

Figure 2:
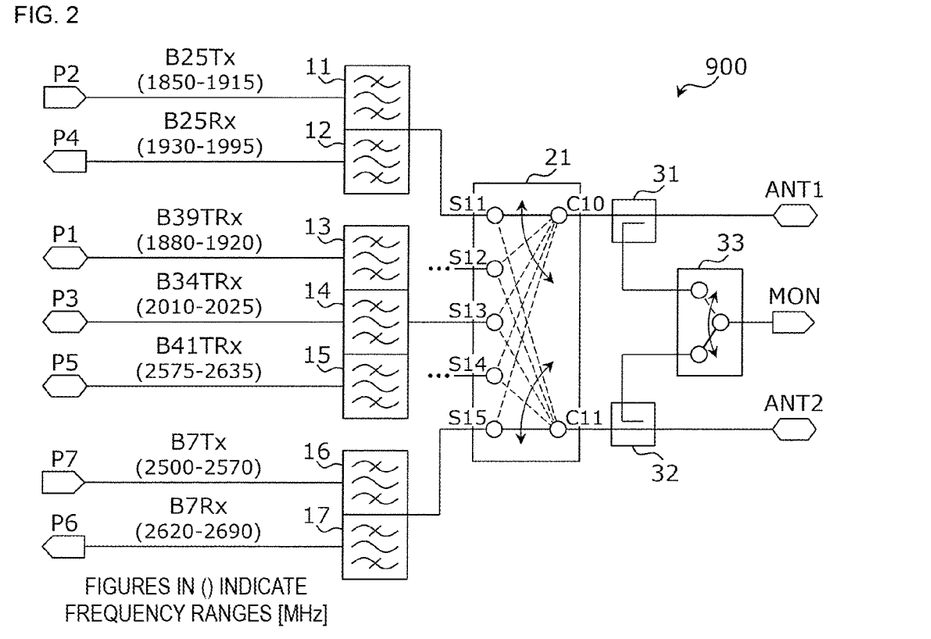
FIG. 2 is a block diagram illustrating an example of the functional configuration of a filter circuit according to a reference example.

FIG. 2 is a block diagram illustrating an example of the functional configuration of a filter circuit according to the reference example. A filter circuit 900 illustrated in FIG. 2 includes signal terminals P1 to P7, filters 11 to 17, switches 21 and 33, directional couplers 31 and 32, antenna terminals ANT1 and ANT2, and a monitor terminal MON.

The filters 11 and 12 are band pass filters using the transmission frequency range B25Tx of Band 25 and the reception frequency range B25Rx thereof, respectively, as pass bands. One end of the filter 11 is connected to the signal terminal P2 and one end of the filter 12 is connected to the signal terminal P4. The other ends of the filters 11 and 12 are connected to each other. The filters 11 and 12 composes a duplexer that performs the demultiplexing and multiplexing of the transmission signal and the reception signal of Band 25.

The filters 13, 14, and 15 are band pass filters using the transmission-reception frequency ranges B39TRx, B34TRx, and B41TRx of Bands 39, 34, and 41, respectively, as the pass bands. One end of the filter 13 is connected to the signal terminal P1, one end of the filter 14 is connected to the signal terminal P3, and one end of the filter 15 is connected to the signal terminal P5. The other ends of the filters 13, 14, and 15 are connected to each other. The filters 13, 14, and 15 compose a triplexer that performs the demultiplexing and multiplexing of the respective transmission-reception signals of Bands 39, 34, and 41.

The filters 16 and 17 are band pass filters using the transmission frequency range B7Tx of Band 7 and the reception frequency range B7Rx thereof, respectively, as the pass bands. One end of the filter 16 is connected to the signal terminal P7 and one end of the filter 17 is connected to the signal terminal P6. The other ends of the filters 16 and 17 are connected to each other. The filters 16 and 17 composes a duplexer that performs the demultiplexing and multiplexing of the transmission signal and the reception signal of Band 7.

The switch 21 has common terminals C10 and C11 to be connected to antennas and multiple selection terminals S11 to S15 to be selectively connected to the common terminals C10 and C11.

The selection terminal S11 of the switch 21 is connected to the duplexer composed of the filters 11 and 12.

The selection terminal S13 of the switch 21 is connected to the triplexer composed of the filters 13, 14, and 15.

The selection terminal S15 of the switch 21 is connected to the duplexer composed of the filters 16 and 17.

The common terminals C10 and C11 of the switch 21 are connected to the antenna terminals ANT1 and ANT2 via the directional couplers 31 and 32, respectively.

The directional coupler 31 is provided on a signal path connecting the common terminal C10 to the antenna terminal ANT1 and outputs a detection signal corresponding to the magnitude of the transmission signal flowing through the signal path.

The directional coupler 32 is provided on a signal path connecting the common terminal C11 to the antenna terminal ANT2 and outputs a detection signal corresponding to the magnitude of the transmission signal flowing through the signal path.

The switch 33 selectively communicates one of the detection signals outputted from the directional couplers 31 and 32 to the monitor terminal MON.

Although the five communication bands are exemplified in the filter circuit 900 for convenience of description, it is necessary to support more communication bands in the practical filter circuit, for example, as in the E-UTRA defining several tens of communication bands. In the filter circuit for performing multi-mode communication so as to conform to a communication standard other than the E-UTRA, it is considered that the number of communication bands to be supported is further increased.

Accordingly, providing two filters for each FDD communication band and providing one filter for each TDD communication band in accordance with the configuration of the filter circuit 900 require so many filters and, thus, it is not possible to avoid an increase in size of the apparatus.

In order to resolve the above problem, a decrease in the number of required filters by sharing one filter between the multiple communication bands will be considered.

Figure 3A:
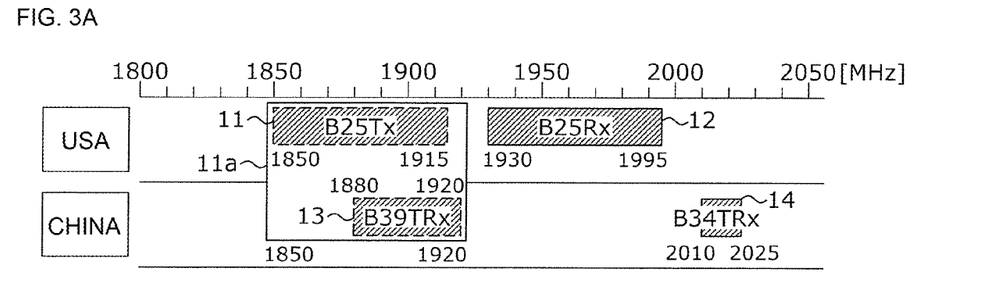
FIG. 3A is a diagram indicating an example of the pass band of a filter.
Figure 3B:
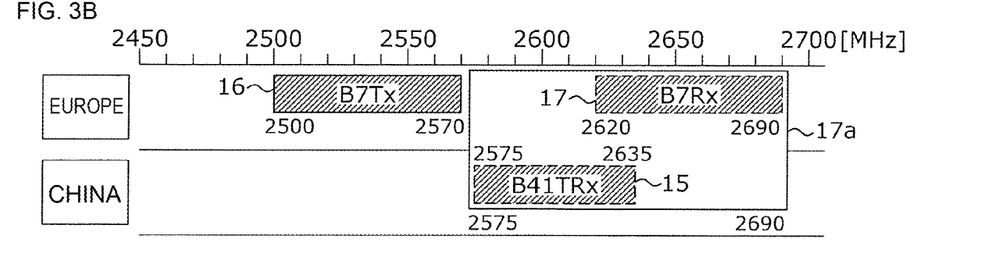
FIG. 3B is a diagram indicating an example of the pass band of a filter.

FIG. 3A and FIG. 3B are diagrams indicating an example of the pass bands of filters. Specifically, the pass bands of the filters corresponding to the respective communication bands indicated in FIG. 1A and FIG. 1B are indicated in FIG. 3A and FIG. 3B. In the pass bands of the filters, filtering of signals of the multiple communication bands the frequency ranges of which are at least partially overlapped and which are not concurrently communicated (in other words, which are exclusively used) is performed by one filter.

The two frequency ranges that are at least partially overlapped with each other means that the high pass end of one frequency range is within the other frequency range and the low pass end of the other frequency range is within the one frequency range and that the one frequency range is completely included in the other frequency range (not illustrated).

Referring to FIG. 3A, for example, Band 25 and Band 39 are operated in USA and China, respectively, and are an example of the communication bands exclusively used in different areas. Other communication bands are not included in both USA and China in the frequency range from 1,850 MHz to 1,920 MHz including the transmission frequency range B25Tx of Band 25 and the transmission-reception frequency range B39TRx of Band 39.

Accordingly, filtering of both the transmission signal of Band 25 and the transmission-reception signal of Band 39 is performed using a filter 11a using the frequency range from 1,850 MHz to 1,920 MHz as the pass band (that is, using both the transmission frequency range B25Tx of Band 25 and the transmission-reception frequency range B39TRx of Band 39 as the pass bands).

Referring to FIG. 3B, for example, Band 7 and Band 41 are operated in Europe and China, respectively, and are an example of the communication bands exclusively used in different areas. Other communication bands are not included in both Europe and China in the frequency range from 2,575 MHz to 2,690 MHz including the reception frequency range B7Rx of Band 7 and the transmission-reception frequency range B41TRx of Band 41.

Accordingly, filtering of both the reception signal of Band 7 and the transmission-reception signal of Band 41 is performed by a filter 17a using the frequency range from 2,575 MHz to 2,690 MHz as the pass band (that is, using both the reception frequency range B7Rx of Band 7 and the frequency range B41TRx of Band 41 as the pass bands).

The filter circuit according to the first embodiment is configured in the following manner based on the above way of thinking.

Figure 4:
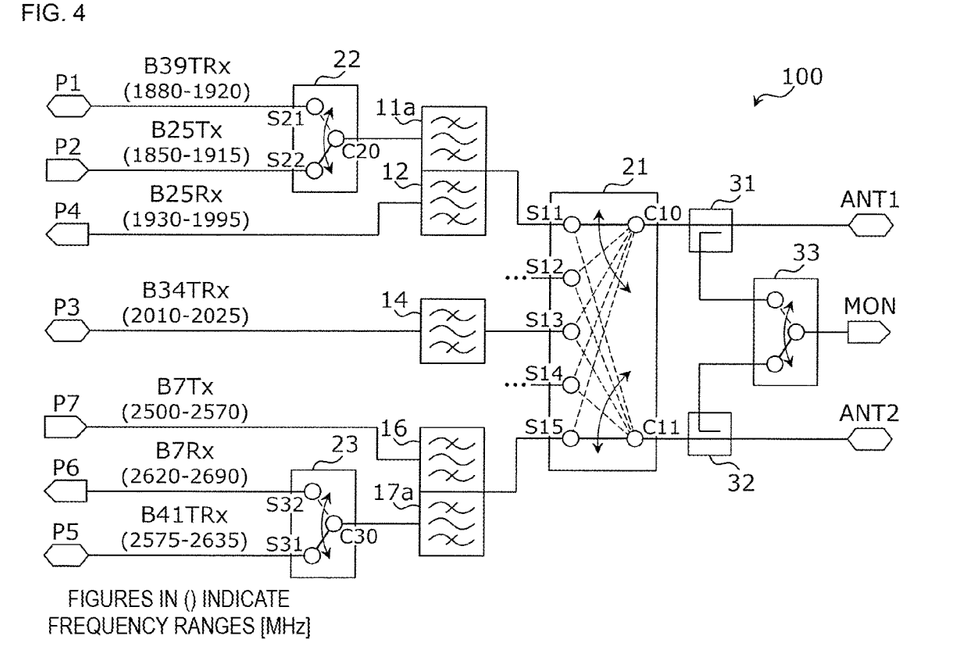
FIG. 4 is a block diagram illustrating an example of the functional configuration of a filter circuit according to a first embodiment.

FIG. 4 is a block diagram illustrating an example of the functional configuration of a filter circuit according to the first embodiment. A filter circuit 100 illustrated in FIG. 4 differs from the filter circuit 900 in FIG. 2 in that the filters 11 and 17 are replaced with the filters 11a and 17a, the filters 13 and 15 are removed, and switches 22 and 23 are added.

The switch 22 has a common terminal C20 and selection terminals S21 and S22 to be exclusively connected to the common terminal C20. The signal terminal P1 is connected to the selection terminal S21 and the transmission-reception signal of Band 39 is communicated through the signal terminal P1. The signal terminal P2 is connected to the selection terminal S22 and the transmission signal of Band 25 is communicated through the signal terminal P2. The transmission-reception frequency range B39TRx of Band 39 and the transmission frequency range B25Tx of Band 25 are at least partially overlapped with each other. The filter 11a is a band pass filter using both the transmission-reception frequency range B39TRx of Band 39 and the transmission frequency range B25Tx of Band 25 as the pass bands. One end of the filter 11a is connected to the common terminal C20.

Here, Band 39 is an example of a first communication band and the transmission-reception frequency range B39TRx of Band 39 is an example of a first frequency range. Band 25 is an example of a second communication band and the transmission frequency range B25Tx of Band 25 is an example of a second frequency range. The transmission-reception signal of Band 39 and the transmission signal of Band 25 are examples of a first communication signal and a second communication signal, respectively. The signal terminals P1 and P2 are examples of a first signal terminal and a second signal terminal, respectively. The switch 22 is an example of a first switch circuit and the common terminal C20 and the selection terminals S21 and S22 are examples of a first common terminal, a first selection terminal, and a second selection terminal, respectively. The filter 11a is an example of a first band pass filter.

The transmission-reception signal of Band 34 is communicated through the signal terminal P3. The transmission-reception frequency range B34TRx of Band 34 and the transmission-reception frequency range B39TRx of Band 39 are not overlapped with each other. The filter 14 is a band pass filter using the transmission-reception frequency range B34TRx of Band 34 as the pass band. One end of the filter 14 is connected to the signal terminal P3.

Here, Band 34 is an example of a third communication band, the transmission-reception frequency range B34TRx of Band 34 is an example of a third frequency range, and the transmission-reception signal of Band 34 is an example of a third communication signal. The signal terminal P3 is an example of a third signal terminal and the filter 14 is an example of a second band pass filter.

The reception signal of Band 25 is communicated through the signal terminal P4. The transmission frequency range B25Tx and the reception frequency range B25Rx of Band 25 are not overlapped with each other. The filter 12 is a band pass filter using the reception frequency range B25Rx of Band 25 as the pass band. One end of the filter 12 is connected to the signal terminal P4. The other end of the filter 11a and the other end of the filter 12 are connected to each other to compose a duplexer for Band 25.

Here, the reception frequency range B25Rx of Band 25 is an example of a fourth frequency range and the reception signal of Band 25 is an example of a fourth communication signal. The signal terminal P4 is an example of a fourth signal terminal and the filter 12 is an example of a third band pass filter.

The switch 23 has a common terminal C30 and selection terminals S31 and S32 to be exclusively connected to the common terminal C30. The signal terminal P5 is connected to the selection terminal S31 and the transmission-reception signal of Band 41 is communicated through the signal terminal P5. The signal terminal P6 is connected to the selection terminal S32 and the reception signal of Band 7 is communicated through the signal terminal P6. The transmission-reception frequency range B41TRx of Band 41 and the reception frequency range B7Rx of Band 7 are at least partially overlapped with each other, and the transmission-reception frequency range B41TRx of Band 41, the transmission-reception frequency range B34TRx of Band 34, and the transmission-reception frequency range B39TRx of Band 39 are not overlapped with each other. The filter 17a is a band pass filter using both the transmission-reception frequency range B41TRx of Band 41 and the reception frequency range B7Rx of Band 7 as the pass bands. One end of the filter 17a is connected to the common terminal C30.

Here, Band 41 is an example of a fourth communication band and the transmission-reception frequency range B41TRx of Band 41 is an example of a fifth frequency range. Band 7 is an example of a fifth communication band and the reception frequency range B7Rx of Band 7 is an example of a sixth frequency range. The transmission-reception signal of Band 41 and the reception signal of Band 7 are examples of a fifth communication signal and a sixth communication signal, respectively. The signal terminals P5 and P6 are examples of a fifth signal terminal and a sixth signal terminal, respectively. The switch 23 is an example of a second switch circuit and the common terminal C30 and the selection terminals S31 and S32 are examples of a second common terminal, a third selection terminal, and a fourth selection terminal, respectively. The filter 17a is an example of a fourth band pass filter.

The transmission signal of Band 7 is communicated through the signal terminal P7. The transmission frequency range B7Tx and the reception frequency range B7Rx of Band 7 are not overlapped with each other. The filter 16 is a band pass filter using the transmission frequency range B7Tx of Band 7 as the pass band. One end of the filter 16 is connected to the signal terminal P7. The other end of the filter 16 and the other end of the filter 17a are connected to each other to compose a duplexer for Band 7.

Here, the transmission frequency range B7Tx of Band 7 is an example of a seventh frequency range and the transmission signal of Band 7 is an example of a seventh communication signal. The signal terminal P7 is an example of a seventh signal terminal and the filter 16 is an example of a fifth band pass filter.

In the filter circuit 100, filtering of one signal exclusively selected from the transmission signal of Band 25 and the transmission-reception signal of Band 39 by the switch 22 is performed by the filter 11a.

In other words, filtering of the transmission-reception signal of Band 39 is performed using the filter 11a, which is also a transmission filter of the duplexer for Band 25.

In addition, in the filter circuit 100, filtering of one signal exclusively selected from the reception signal of Band 7 and the transmission-reception signal of Band 41 by the switch 23 is performed by the filter 17a.

In other words, filtering of the transmission-reception signal of Band 41 is performed using the filter 17a, which is also a reception filter of the duplexer for Band 7.

With the filter circuit 100 described above, for example, the following advantages are achieved, compared with the filter circuit 900 in FIG. 2.

As described above, in the filter circuit 900, the demultiplexing and multiplexing of the transmission signals and the reception signals of Band 25 and Band 7 the duplex mode of which is the FDD are performed by the duplexer composed of the filters 11 and 12 and the duplexer composed of the filters 16 and 17, respectively. In addition, the demultiplexing and multiplexing of the respective transmission-reception signals of Band 39, band 34, and Band 41 the duplex mode of which is the TDD are performed by the multiplexer composed of the filters 13, 14, and 15 for the respective communication bands.

In other words, in the filter circuit 900, the transmission signals and the reception signals of the communication bands the duplex mode of which is the FDD and the transmission-reception signals of the communication bands the duplex mode of which is the TDD are processed by the separate filters included in the duplexers and the multiplexer.

In contrast, in the filter circuit 100, the filter 13 is removed and the filter 11 is replaced with the filter 11a the pass band of which is extended so as to include the pass bands of both the filter 13 and the filter 11. In addition, the filter 15 is removed and the filter 17 is replaced with the filter 17a the pass band of which is extended so as to include the pass bands of both the filter 15 and the filter 17.

As a result, with the filter circuit 100, the number of required filters is decreased by two, compared with that in the filter circuit 900, while supporting the multiband communication using the five communication bands of Bands 7, 25, 34, 39, and 41.

As described above, the signals of the FDD communication bands and the signals of the TDD communication bands have hitherto been processed by the separate filters, as in the filter circuit 900 in FIG. 2. In contrast, in the filter circuit 100, as for the FDD communication band and the TDD communication band which are exclusively used and the frequency ranges of which are at least partially overlapped with each other, the pass band of the filter for the FDD communication band is extended so as to include the pass band of the filter for the TDD communication band and the switches for exclusive control are added. Accordingly, the FDD communication band and the TDD communication band are processed by the same filter to enable the reduction in size of the apparatus.

The switch 21 illustrated in FIG. 4 is not essential. Since the pass bands of the filters 11a, 12, 14, 16, and 17a are not overlapped with each other, the other ends of all the filters 11a, 12, 14, 16, and 17a may be connected to compose a multiplexer (not illustrated). In this case, a filter circuit without the switch 21 and with a single antenna terminal is achieved. Also, in such a filter circuit, it is possible to decrease the number of required filters, as in the filter circuit 100.

The combinations of the communication bands sharing the filters are not limited to the above example. For example, the filters may be shared using the following combinations of the communication bands.

Figure 5:
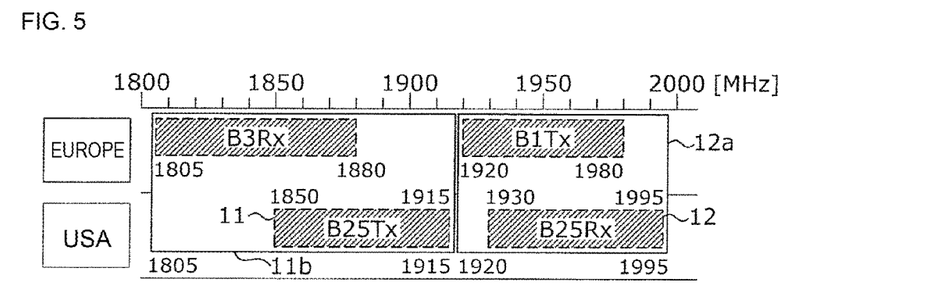
FIG. 5 is a diagram indicating another example of the pass bands of filters.

FIG. 5 is a diagram indicating another example of the pass bands of filters.

Referring to FIG. 5, for example, Band 3 and Band 25 are operated in Europe and USA, respectively, and are an example of the communication bands exclusively used in different areas. Other communication bands are not included in both Europe and USA in the frequency range from 1,805 MHz to 1,915 MHz including a reception frequency range B3Rx of Band 3 and the transmission frequency range B25Tx of Band 25.

Accordingly, filtering of both the reception signal of Band 3 and the transmission signal of Band 25 is performed by a filter 11b using the frequency range from 1,805 MHz to 1,915 MHz as the pass band (that is, using both of the frequency ranges B3Rx and B25Tx as the pass bands).

In addition, for example, Band 1 and Band 25 are operated in Europe and USA, respectively, and are an example of the communication bands exclusively used in different areas. Other communication bands are not included in both Europe and USA in the frequency range from 1,920 MHz to 1,995 MHz including a transmission frequency range B1Tx of Band 1 and the reception frequency range B25Rx of Band 25.

Accordingly, filtering of both the transmission signal of Band 1 and the reception signal of Band 25 is performed by a filter 12a using the frequency range from 1,920 MHz to 1,995 MHz as the pass band (that is, using both the transmission frequency range B1Tx of Band 1 and the reception frequency range B25Rx of Band 25 as the pass bands).

With the filter circuit configured in the above manner, filtering of the reception signal of Band 3 and the transmission signal of Band 25 is performed by the same filter 11*b*. In addition, filtering of the transmission signal of Band 1 and the reception signal of Band 25 is performed by the same filter 12*a*. This reduces the number of required filters by two to suppress the increase in size of the apparatus.

Second Embodiment

A radio-frequency module according to a second embodiment will now be described, giving an example of a radio-frequency module that includes the filter circuit according to the first embodiment and that supports carrier aggregation communication in which communication is performed by concurrently using two communication bands.

Figure 6A:
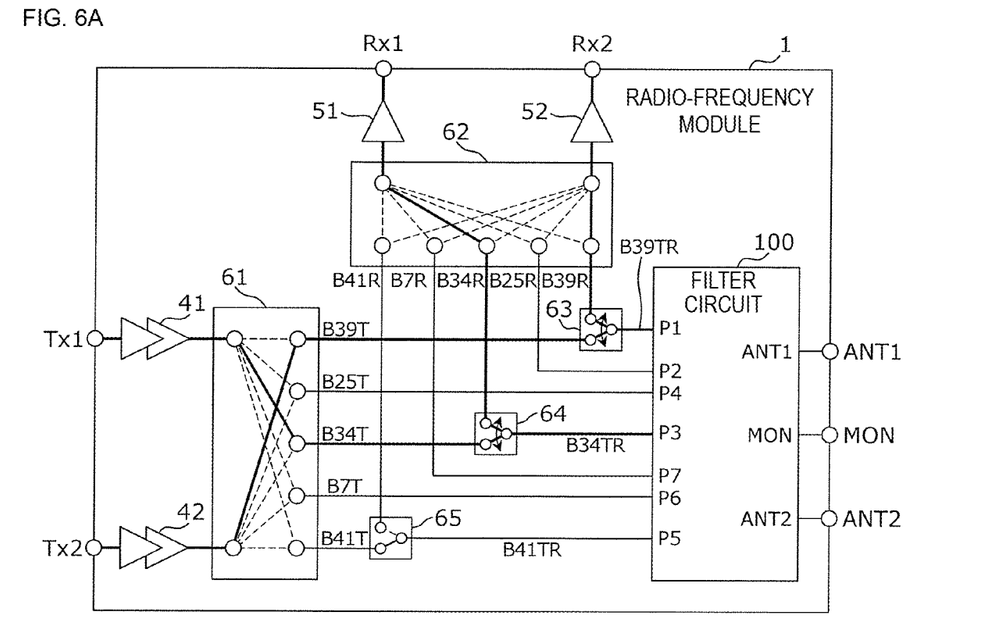
FIG. 6A is a block diagram illustrating an example of the functional configuration of a radio-frequency module according to a second embodiment.
Figure 6B:
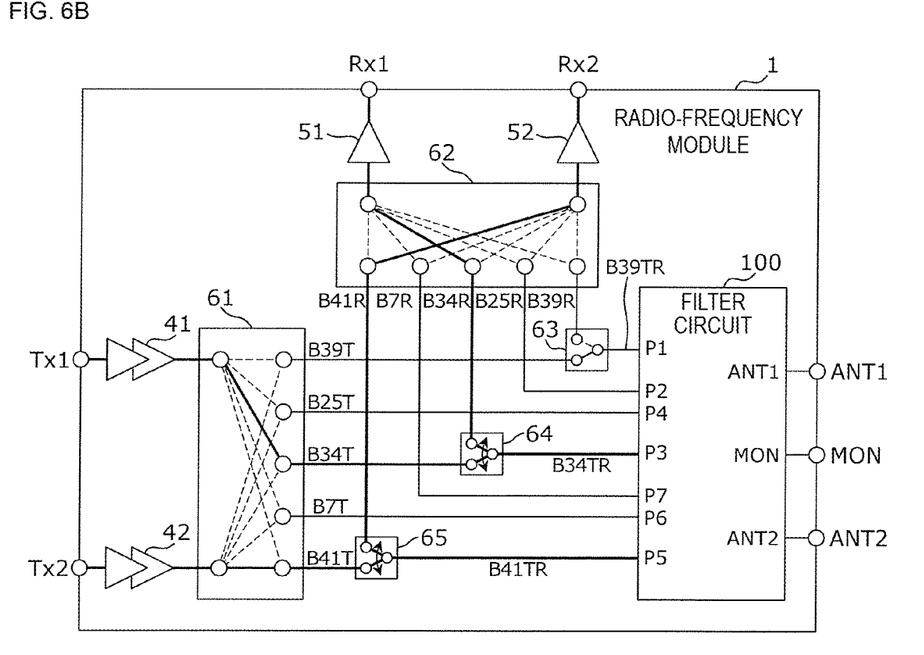
FIG. 6B is a block diagram illustrating an example of the functional configuration of the radio-frequency module according to the second embodiment.
Figure 6C:
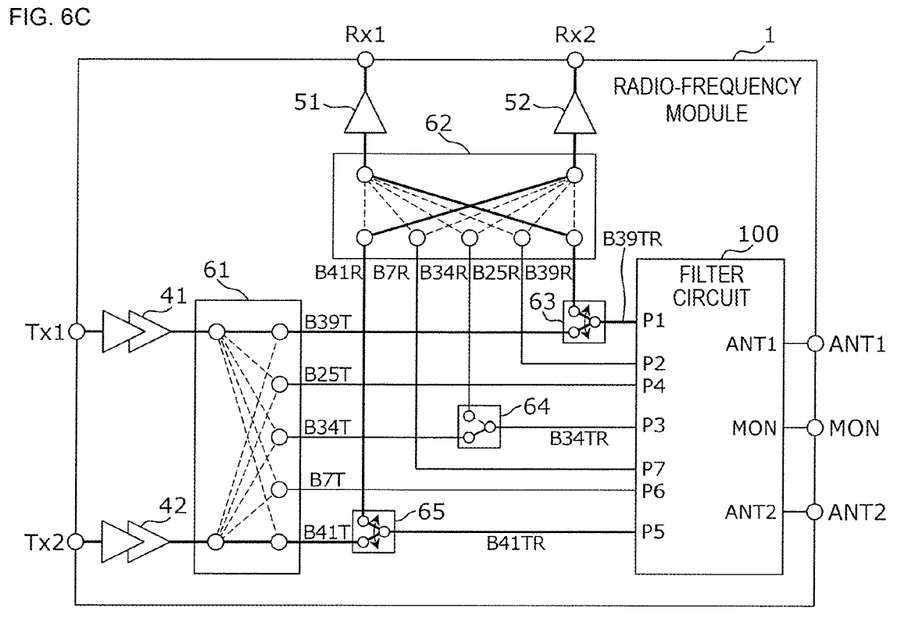
FIG. 6C is a block diagram illustrating an example of the functional configuration of the radio-frequency module according to the second embodiment.

FIG. 6A, FIG. 6B, and FIG. 6C are block diagrams illustrating an example of the functional configuration of the radio-frequency module according to the second embodiment and illustrate different connection states of the same radio-frequency module. As illustrated in FIG. 6A, FIG. 6B, and FIG. 6C, a radio-frequency module 1 includes power amplifiers 41 and 42, low noise amplifiers 51 and 52, switches 61 to 65, and the filter circuit 100. The filter circuit 100 is the filter circuit 100 illustrated in FIG. 4.

The switch 61 switches the connection between an output end of each of the power amplifiers 41 and 42 and any one path of transmission signal paths B39T, B25T, B34T, B7T, and B41T provided for the respective communication bands.

The switch 62 switches the connection between an input end of each of the low noise amplifiers 51 and 52 and any one path of reception signal paths B39R, B25R, B34R, B7R, and B41R provided for the respective communication bands.

The switch 63 switches the connection between a transmission-reception signal path B39TR provided for Band 39 and any one path of the transmission signal path B39T and the reception signal path B39R.

The switch 64 switches the connection between a transmission-reception signal path B34TR provided for Band 34 and any one path of the transmission signal path B34T and the reception signal path B34R.

The switch 65 switches the connection between a transmission-reception signal path B41TR provided for Band 41 and any one path of the transmission signal path B41T and the reception signal path B41R.

The switches 61 to 65 compose a switch network. The switch network operates in one mode selected at least from a first mode, a second mode, and a third mode in accordance with a control signal (not illustrated). In FIG. 6A, FIG. 6B, and FIG. 6C, the signal paths connected in the first mode, the second mode, and the third mode, respectively, are illustrated with the bold lines.

In the first mode, the switch network switches between connection of the signal terminal P3 of the filter circuit 100 to the power amplifier 41 and connection of the signal terminal P3 of the filter circuit 100 to the low noise amplifier 51 and switches between connection of the signal terminal P1 to the power amplifier 42 and connection of the signal terminal P1 to the low noise amplifier 52 (FIG. 6A).

In this connection state, the transmission signal and the reception signal of Band 34 are amplified by the power amplifier 41 and the low noise amplifier 51, respectively, and, concurrently, the transmission signal and the reception signal of Band 39 are amplified by the power amplifier 42 and the low noise amplifier 52, respectively. As a result, the carrier aggregation with Bands 34 and 39 is performed in the first mode.

In the second mode, the switch network switches between connection of the signal terminal P3 of the filter circuit 100 to the power amplifier 41 and connection of the signal terminal P3 of the filter circuit 100 to the low noise amplifier 51 and switches between connection of the signal terminal P5 to the power amplifier 42 and connection of the signal terminal P5 to the low noise amplifier 52 (FIG. 6B).

In this connection state, the transmission signal and the reception signal of Band 34 are amplified by the power amplifier 41 and the low noise amplifier 51, respectively, and, concurrently, the transmission signal and the reception signal of Band 41 are amplified by the power amplifier 42 and the low noise amplifier 52, respectively. As a result, the carrier aggregation with Bands 34 and 41 is performed in the second mode.

In the third mode, the switch network switches between connection of the signal terminal P1 of the filter circuit 100 to the power amplifier 41 and connection of the signal terminal P1 of the filter circuit 100 to the low noise amplifier 51 and switches between connection of the signal terminal P5 to the power amplifier 42 and connection of the signal terminal P5 to the low noise amplifier 52 (FIG. 6C).

In this connection state, the transmission signal and the reception signal of Band 39 are amplified by the power amplifier 41 and the low noise amplifier 51, respectively, and, concurrently, the transmission signal and the reception signal of Band 41 are amplified by the power amplifier 42 and the low noise amplifier 52, respectively. As a result, the carrier aggregation with Bands 39 and 41 is performed in the third mode.

With the above configuration, the radio-frequency module 1 is achieved, which is capable of performing the carrier aggregation communication in the three combinations of Band 34 and Band 39 in the first mode, of Band 34 and Band 41 in the second mode, and of Band 39 and Band 41 in the third mode. In addition, as described in the first embodiment, since the filter circuit 100 is used, the advantage of suppressing the increase in size of the apparatus is also achieved.

(Outline)

A filter circuit according to one aspect of the present disclosure includes a first switch circuit that includes a first common terminal, a first selection terminal, and a second selection terminal and that exclusively connects the first common terminal to either of the first selection terminal and the second selection terminal; a first signal terminal that is connected to the first selection terminal and that is for communicating a first communication signal belonging to a first frequency range, which is a frequency range of a first communication band; a second signal terminal that is connected to the second selection terminal and that is for communicating a second communication signal belonging to a second frequency range, which is the frequency range of a second communication band exclusively used with the first communication band and which is at least partially overlapped with the first frequency range; and a first band pass filter one end of which is connected to the first common terminal and which uses both the first frequency range and the second frequency range as pass bands.

With the above configuration, filtering of the first communication signal in the first communication band and the second communication signal in the second communication band is performed by the single first band pass filter. Accordingly, the number of required filters is decreased, compared with a case in which filtering of the first communication signal and the second communication signal is performed by separate filters. Consequently, it is possible to achieve the filter circuit that is less likely to cause an increase in size of the apparatus even if the number of communication bands is increased.

A duplex mode of the first communication band may be time division duplex and the duplex mode of the second communication band may be frequency division duplex.

With the above configuration, it is possible to decrease the number of required filters, compared with a configuration in related art in which the signal in the communication band for the time division duplex and the signal in the communication band for the frequency division duplex are processed by the separate filters in the duplexer and the multiplexer, respectively.

The filter circuit may further include a third signal terminal for communicating a third communication signal belonging to a third frequency range, which is the frequency range of a third communication band and which is not overlapped with the first frequency range, and a second band pass filter one end of which is connected to the third signal terminal and which uses the third frequency range as the pass band.

Demultiplexing and multiplexing of the first communication signal and the third communication signal, the frequency ranges of which are not overlapped with each other, has hitherto been generally performed by a multiplexer composed of the filters for the respective communication signals. In contrast, with the above configuration, the filter for the first communication signal, which is included in the multiplexer, may be replaced with the single first band pass filter, which performs filtering of the first communication signal and the second communication signal. As a result, since the number of required filters is decreased, it is possible to achieve the filter circuit that is less likely to cause an increase in size of the apparatus even if the number of communication bands is increased.

The second communication band may include a transmission frequency range and a reception frequency range that are not overlapped with each other, and the second frequency range may be one of the transmission frequency range and the reception frequency range of the second communication band. The filter circuit may further include a fourth signal terminal for communicating a fourth communication signal belonging to a fourth frequency range, which is the other of the transmission frequency range and the reception frequency range of the second communication band, and a third band pass filter one end of which is connected to the fourth signal terminal and which uses the fourth frequency range as the pass band.

The other end of the first band pass filter may be connected to the other end of the third band pass filter to compose a multiplexer.

With the above configuration, the first band pass filter and the third band pass filter are one and the other of the transmission filter and the reception filter for the second communication band and the multiplexer functions as the duplexer for the second communication band. In other words, filtering of the first communication signal is performed by using the transmission filter or the reception filter of the duplexer for the second communication band. Accordingly, since the number of required filters is decreased, it is possible to achieve the filter circuit that is less likely to cause an increase in size of the apparatus even if the number of communication bands is increased.

The filter circuit may further include a second switch circuit that includes a second common terminal, a third selection terminal, and a fourth selection terminal and that exclusively connects the second common terminal to either of the third selection terminal and the fourth selection terminal; a fifth signal terminal that is connected to the third selection terminal and that is for communicating a fifth communication signal belonging to a fifth frequency range, which is the frequency range of a fourth communication band; a sixth signal terminal that is connected to the fourth selection terminal and that is for communicating a sixth communication signal belonging to a sixth frequency range, which is the frequency range of a fifth communication band exclusively used with the fourth communication band and which is at least partially overlapped with the fifth frequency range; and a fourth band pass filter one end of which is connected to the second common terminal and which uses both the fifth frequency range and the sixth frequency range as the pass bands.

With the above configuration, filtering of the fifth communication signal in the fourth communication band and the sixth communication signal in the fifth communication band is performed by the single fourth band pass filter. Accordingly, the number of required filters is decreased, compared with a case in which filtering of the fifth communication signal and the sixth communication signal is performed by separate filters. Consequently, it is possible to achieve the filter circuit that is less likely to cause an increase in size of the apparatus even if the number of communication bands is increased.

The duplex mode of the fourth communication band may be time division duplex and the duplex mode of the fifth communication band may be frequency division duplex.

With the above configuration, it is possible to decrease the number of required filters, compared with a configuration in related art in which the signal in the communication band for the time division duplex and the signal in the communication band for the frequency division duplex are processed by the separate filters in the duplexer and the multiplexer, respectively.

The fifth frequency range may not be overlapped with the third frequency range and the first frequency range.

Demultiplexing and multiplexing of the fifth communication signal, the third communication signal, and the first communication signal, the frequency ranges of which are not overlapped with each other, has hitherto been generally performed by a multiplexer composed of the filters for the respective communication signals. In contrast, with the above configuration, the filter for the fifth communication signal, which is included in the multiplexer, may be replaced with the single fourth band pass filter, which performs filtering of the fifth communication signal and the sixth communication signal. As a result, since the number of required filters is decreased, it is possible to achieve the filter circuit that is less likely to cause an increase in size of the apparatus even if the number of communication bands is increased.

The fifth communication band may include a transmission frequency range and a reception frequency range that are not overlapped with each other and the sixth frequency range may be one of the transmission frequency range and the reception frequency range of the fifth communication band. The filter circuit may further include a seventh signal terminal for communicating a seventh communication signal belonging to a seventh frequency range, which is the other of the transmission frequency range and the reception frequency range of the fifth communication band, and a fifth band pass filter one end of which is connected to the seventh signal terminal and which uses the seventh frequency range as the pass band.

The other end of the fourth band pass filter may be connected to the other end of the fifth band pass filter to compose a multiplexer.

With the above configuration, the fourth band pass filter and the fifth band pass filter are one and the other of the transmission filter and the reception filter for the fifth communication band and the multiplexer is the duplexer for the fifth communication band. In other words, filtering of the fifth communication signal is performed by using the transmission filter or the reception filter composing the duplexer for the fifth communication band. Accordingly, since the number of required filters is decreased, it is possible to achieve the filter circuit that is less likely to cause an increase in size of the apparatus even if the number of communication bands is increased.

The first frequency range may be a frequency range from 1,880 MHz to 1,920 MHz, which is a transmission-reception frequency range of Band 39 in the E-UTRA, and the second frequency range may be a frequency range from 1,850 MHz to 1,915 MHz, which is a transmission frequency range of Band 25 in the E-UTRA.

The third frequency range may be a frequency range from 2,010 MHz to 2,025 MHz, which is the transmission-reception frequency range of Band 34 in the E-UTRA.

The fourth frequency range may be a frequency range from 1,930 MHz to 1,995 MHz, which is a reception frequency range of Band 25 in the E-UTRA.

The fifth frequency range may be a frequency range from 2,575 MHz to 2,635 MHz, which is part of the transmission-reception frequency range of Band 41 in the E-UTRA and the sixth frequency range may be a frequency range from 2,620 MHz to 2,690 MHz, which is a reception frequency band of Band 7 in the E-UTRA.

The seventh frequency range may be a frequency range from 2,500 MHz to 2,570 MHz, which is a transmission frequency band of Band 7 in the E-UTRA.

The first frequency range may be a frequency range from 1,805 MHz to 1,880 MHz, which is the reception frequency band of Band 3 in the E-UTRA and the second frequency range may be a frequency range from 1,850 MHz to 1,915 MHz, which is the transmission frequency band of Band 25 in the E-UTRA.

The first frequency range may be a frequency range from 1,920 MHz to 1,980 MHz, which is the transmission frequency band of Band 1 in the E-UTRA and the second frequency range may be a frequency range from 1,930 MHz to 1,995 MHz, which is the reception frequency band of Band 25 in the E-UTRA.

With the above configuration, the filter circuit having the advantages described above is applicable to the specific communication bands in the E-UTRA.

A radio-frequency module according to one aspect of the present disclosure includes the filter circuit and a power amplifier and a low noise amplifier electrically connected to the filter circuit.

With the above configuration, the use of the filter circuit having the advantages described above achieves the radio-frequency module that is less likely to cause an increase in size of the apparatus even if the number of communication bands is increased.

In the radio-frequency module, the one or more power amplifiers may include a first power amplifier and a second power amplifier, the one or more low noise amplifiers may include a first low noise amplifier and a second low noise amplifier, a switch network may be provided between the filter circuit and the first power amplifier, the second power amplifier, the first low noise amplifier, and the second low noise amplifier, and the switch network may have multiple operation modes at least including a first mode, a second mode, and a third mode. In the first mode, switching between connection of the third signal terminal of the filter circuit to the first power amplifier and connection of the third signal terminal thereof to the first low noise amplifier and switching between connection of the first signal terminal of the filter circuit to the second power amplifier and connection of the first signal terminal thereof to the second low noise amplifier may be performed. In the second mode, switching between connection of the third signal terminal of the filter circuit to the first power amplifier and connection of the third signal terminal thereof to the first low noise amplifier and switching between connection of the fifth signal terminal of the filter circuit to the second power amplifier and connection of the fifth signal terminal thereof to the second low noise amplifier may be performed. In the third mode, switching between connection of the first signal terminal of the filter circuit to the first power amplifier and connection of the first signal terminal thereof to the first low noise amplifier and switching between connection of the fifth signal terminal of the filter circuit to the second power amplifier and connection of the fifth signal terminal thereof to the second low noise amplifier may be performed.

With the above configuration, the radio-frequency module is achieved, which is capable of performing the carrier aggregation communication in the three combinations of the first communication band and the third communication band in the first mode, of the third communication band and the fourth communication band in the second mode, and of the first communication band and the fourth communication band in the third mode.

Although the filter circuit and the radio-frequency module according to the embodiments of the present disclosure are described above, the present disclosure is not limited to the individual embodiments. Modifications resulting from making various changes supposed by the persons skilled in the art to the above embodiments and modes built by combining components in different embodiments may also be included in the range of one or multiple aspects of the present disclosure without departing from the scope and sprit of the present disclosure.

The present disclosure is widely usable for various communication apparatuses as the filter circuit and the radio-frequency module.

1 radio-frequency module
11, 11a, 11b, 12, 12a, 13 to 17, 17a filter
21, 22, 23, 33, 61 to 65 switch
31, 32 directional coupler
41, 42 power amplifier
51, 52 low noise amplifier
100, 900 filter circuit

The invention claimed is:

1. A filter circuit comprising:
a first switch that includes a first common terminal, a first selection terminal, and a second selection terminal and that exclusively connects the first common terminal to either of the first selection terminal and the second selection terminal;
a first signal terminal connected to the first selection terminal, the first signal terminal communicating a first communication signal belonging to a first frequency range, which is a frequency range of a first communication band;

a second signal terminal connected to the second selection terminal, the second signal terminal communicating a second communication signal belonging to a second frequency range, which is the frequency range of a second communication band exclusively used with the first communication band and which is at least partially overlapped with the first frequency range; and a first band pass filter having a first end connected to the first common terminal of the first switch, the first band pass filter using both the first frequency range and the second frequency range as pass bands, wherein at least one power amplifier includes a first power amplifier and a second power amplifier, at least one low noise amplifier includes a first low noise amplifier and a second low noise amplifier, a switch network is provided between the filter circuit and the first power amplifier, the second power amplifier, the first low noise amplifier, and the second low noise amplifier, the switch network has a plurality of operation modes at least including a first mode, a second mode, and a third mode, the first mode performing switching between connection of a third signal terminal of the filter circuit to the first power amplifier and connection of the third signal terminal thereof to the first low noise amplifier and switching between connection of the first signal terminal of the filter circuit to the second power amplifier and connection of the first signal terminal thereof to the second low noise amplifier, the second mode performing switching between connection of the third signal terminal of the filter circuit to the first power amplifier and connection of the third signal terminal thereof to the first low noise amplifier and switching between connection of a fifth signal terminal of the filter circuit to the second power amplifier and connection of the fifth signal terminal thereof to the second low noise amplifier, and the third mode performing switching between connection of the first signal terminal of the filter circuit to the first power amplifier and connection of the first signal terminal thereof to the first low noise amplifier and switching between connection of the fifth signal terminal of the filter circuit to the second power amplifier and connection of the fifth signal terminal thereof to the second low noise amplifier.

2. The filter circuit according to claim 1,
wherein a duplex mode of the first communication band is Time Division Duplex,
wherein the duplex mode of the second communication band is Frequency Division Duplex, and
wherein the first communication band and the second communication band are used exclusively.

3. The filter circuit according to claim 1, further comprising:
the third signal terminal communicating a third communication signal belonging to a third frequency range, which is the frequency range of a third communication band and which is not overlapped with the first frequency range; and
a second band pass filter having a first end connected to the third signal terminal, the second band pass filter using the third frequency range as the pass band.

4. The filter circuit according to claim 1,
wherein the second communication band includes a transmission frequency range and a reception frequency range that are not overlapped with each other and the second frequency range is one of the transmission frequency range or the reception frequency range of the second communication band, the filter circuit further comprising:
a fourth signal terminal communicating a fourth communication signal belonging to a fourth frequency range, which is the other of the transmission frequency range or the reception frequency range of the second communication band; and
a third band pass filter having a first end connected to the fourth signal terminal, the third band pass filter using the fourth frequency range as the pass band.

5. The filter circuit according to claim 4,
wherein a second end of the first band pass filter is connected to a second end of the third band pass filter to compose a multiplexer.

6. The filter circuit according to claim 1, further comprising:
a second switch that includes a second common terminal, a third selection terminal, and a fourth selection terminal and that exclusively connects the second common terminal to either of the third selection terminal and the fourth selection terminal;
the fifth signal terminal connected to the third selection terminal, the fifth signal terminal communicating a fifth communication signal belonging to a fifth frequency range, which is the frequency range of a fourth communication band;
a sixth signal terminal connected to the fourth selection terminal, the sixth signal terminal communicating a sixth communication signal belonging to a sixth frequency range, which is the frequency range of a fifth communication band exclusively used with the fourth communication band and which is at least partially overlapped with the fifth frequency range; and
a fourth band pass filter having a first end connected to the second common terminal, the fourth band pass filter using both the fifth frequency range and the sixth frequency range as the pass bands.

7. The filter circuit according to claim 6,
wherein a duplex mode of the fourth communication band is Time Division Duplex, and
wherein the duplex mode of the fifth communication band is Frequency Division Duplex.

8. The filter circuit according to claim 6,
wherein the fifth frequency range is not overlapped with the third frequency range and the first frequency range.

9. The filter circuit according to claim 6,
wherein the fifth communication band includes a transmission frequency range and a reception frequency range that are not overlapped with each other and the sixth frequency range is one of the transmission frequency range or the reception frequency range of the fifth communication band, the filter circuit further comprising:
a seventh signal terminal communicating a seventh communication signal belonging to a seventh frequency range, which is the other of the transmission frequency range or the reception frequency range of the fifth communication band; and
a fifth band pass filter having a first end connected to the seventh signal terminal, the fifth band pass filter using the seventh frequency range as the pass band.

10. The filter circuit according to claim 9,
wherein a second end of the fourth band pass filter is connected to a second end of the fifth band pass filter to compose a multiplexer.

11. The filter circuit according to claim 1,
wherein the first frequency range is a frequency range from 1,880 MHz to 1,920 MHz, which is a transmission-reception frequency range of Band 39 in Evolved Universal Terrestrial Radio Access (E-UTRA), and the second frequency range is a frequency range from 1,850 MHz to 1,915 MHz, which is a transmission frequency range of Band 25 in the E-UTRA.

12. The filter circuit according to claim 3,
wherein the third frequency range is a frequency range from 2,010 MHz to 2,025 MHz, which is the transmission-reception frequency range of Band 34 in the E-UTRA.

13. The filter circuit according to claim 4,
wherein the fourth frequency range is a frequency range from 1,930 MHz to 1,995 MHz, which is a reception frequency range of Band 25 in the E-UTRA.

14. The filter circuit according to claim 6,
wherein the fifth frequency range is a frequency range from 2,575 MHz to 2,635 MHz, which is part of the transmission-reception frequency range of Band 41 in the E-UTRA and the sixth frequency range is a frequency range from 2,620 MHz to 2,690 MHz, which is the reception frequency band of Band 7 in the E-UTRA.

15. The filter circuit according to claim 9,
wherein the seventh frequency range is a frequency range from 2,500 MHz to 2,570 MHz, which is the transmission frequency band of Band 7 in the E-UTRA.

16. The filter circuit according to claim 1,
wherein the first frequency range is a frequency range from 1,805 MHz to 1,880 MHz, which is the reception frequency band of Band 3 in Evolved Universal Terrestrial Radio Access (E-UTRA) and the second frequency range is a frequency range from 1,850 MHz to 1,915 MHz, which is the transmission frequency band of Band 25 in the E-UTRA.

17. The filter circuit according to claim 1,
wherein the first frequency range is a frequency range from 1,920 MHz to 1,980 MHz, which is the transmission frequency band of Band 1 in the E-UTRA and the second frequency range is a frequency range from 1,930 MHz to 1,995 MHz, which is the reception frequency band of Band 25 in the E-UTRA.

18. A radio-frequency circuit comprising:

the filter circuit according to claim 1; and the at least one power amplifier and the at least one low noise amplifier are electrically connected to the filter circuit.

19. A radio-frequency circuit comprising:

the filter circuit according to claim 9; and the at least one power amplifier and the least one low noise amplifier are electrically connected to the filter circuit.

* * * * *